April 2, 1968 M. PRAGER 3,376,412

DIGITAL FREQUENCY FILTER AND FUNCTION GENERATOR

Filed Dec. 13, 1963 3 Sheets-Sheet 1

INVENTOR.
MELVIN PRAGER

BY

Rosen & Schiller

ATTORNEYS

INVENTOR.
MELVIN PRAGER
BY
Rosen & Schiller
ATTORNEYS

INVENTOR.
MELVIN PRAGER

BY

Roden & Schiller

ATTORNEYS 3,376,412
DIGITAL FREQUENCY FILTER AND FUNCTION GENERATOR
Melvin Prager, West Palm Beach, Fla., assignor, by mesne assignments, to Honeywell Inc., a corporation of Delaware
Continuation-in-part of application Ser. No. 299,745, Aug. 5, 1963. This application Dec. 13, 1963, Ser. No. 331,343
19 Claims. (Cl. 235—165)

This application is a continuation-in-part of Ser. No. 299,745, Aug. 5, 1963.

This invention relates to frequency function generation, and particularly to the generation of frequency functions by digital techniques.

Devices capable of performing operations on the frequency of a given input signal (i.e. generating an output frequency which is a function of the input frequency) are well known, and include devices operating on input frequencies of either continuous (e.g. sinusoidal type) or discontinuous (e.g. pulse or square wave type) periodic processes. Typical devices of this nature are known frequency multipliers, frequency dividers, frequency squarers, and the like, which can be considered static devices in that the equation of the function relating input to output frequencies has no differential coefficients. Also known are dynamic devices such as frequency modulators wherein the output frequency is differentially related to an independent variable such as the input frequency.

The latter category of devices is usually an analog instrument, i.e. the techniques for varying frequency as a first or higher order derivative are not through quantized steps, and the accuracy of the relationship between independent variable and output frequency is limited. For example, if one wishes to provide a signal generator by which an output frequency is determined as a linear function of a ramp voltage, there are readily available voltage-to-frequency converters of the analog type such as the unit described in Electronics, vol. 36, No. 17, Apr. 26, 1963, pp. 64, 65. However, analog devices are often not either as flexible or as capable of inherent extension of accuracy as digital devices. Analog devices also reflect in their output discontinuities in their input. For example, if, in a voltage-to-frequency converter of the type above described, the input voltage changes from one level to another substantially instantaneously, the output function, i.e. frequency, will abruptly and discontinuously change also.

Where one wishes to employ, for example, a stepping motor as in a plotter device, it is known that while the step-motor can be made to operate at speeds considerably above the "maximum" start-stop speed recommended if acceleration and deceleration limits are observed, the motor will not respond with accuracy to input pulse trains whose repetition rate varies discontinuously. If one employs a pulse train as an input to a rate-multiplier device, it will be apparent that if the multiplication factor is large, sharp changes in the repetition rate of the pulse train will emerge from the multiplier as rate changes of slopes so high as to be considered discontinuities. Obviously then, the output of such rate-multiplier devices do not appear to be appropriate for use as stepping motor input.

A principal object of the present invention is therefore to provide a digital frequency "filter" which will accept as an input a periodic signal train which can vary discretely or discontinuously in its frequency or repetition rate, and provide an output in which the frequency varies smoothly or continuously within the limitation imposed by digital increments. Other objects of the present invention are to provide such a "filter" comprising means for serially time-compressing binary representation, taken at a predetermined rate, of the frequency of an input signal, and means for time-expanding the compressed binary representations so as to provide an output signal having a frequency which is a weighted average, over a predetermined time period, of the input signal frequency; to provide a "filter" of the type described wherein the means for serially time-compressing includes a serial data storage device having a predetermined storage time, and the time period over which the input frequency is averaged is determined in accordance with the storage time of the storage device and rate at which the binary representations are taken; and to provide a basic "filter" system which can be employed in a variety of configurations as a building block in the construction of digital frequency function generators.

Further objects of the present invention are to provide, through the use of digital techniques, systems for generating frequency functions, which are capable of high stability, accuracy and flexibility of performance; to provide such systems, employing time-compression techniques, to generate periodic output signals whose frequency or repetition rate is related to an input or base signal frequency linearly, exponentially or the like; and to provide such systems wherein time-compression is basically achieved by the selective gating of feedback signals from the output to the input of a serial memory or signal storage device.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims. For a fuller understanding of the nature and objects of the present invention, reference should be had to the following detailed description taken in connection with the accompanying drawings wherein:

Figure 1:
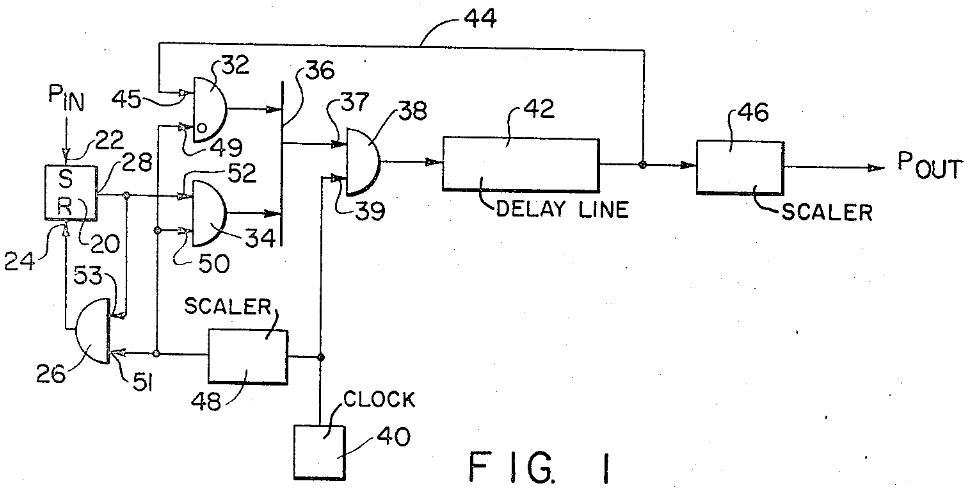
FIG. 1 is a block logic diagram of an embodiment of the present invention which provides a digital filter.

In effecting the foregoing objects, the present invention employs a novel digital delay-line time-compression technique. Certain time-compression techniques are known in the digital arts and have been, in a form known as a Deltic loop, described in detail by Rosenbloom, Electronics, Mar. 10, 1961, and by V. C. Anderson, Technical Memorandum No. 37 (NR–014–903) Harvard Univ., Acoustics Laboratory, Jan. 5, 1956. The Deltic loop samples the amplitude of a variable amplitude input signal and time-compresses the amplitude envelope such that the output signal, while having substantially the same amplitude information as the input signal, is at a considerably higher frequency. Thus, long term changes in amplitude are time-compressed and through the use of the Deltic loop in signal correlation equipment, a large number of amplitude correlations can be realized in reduced real-time. Additionally, the Deltic loop has found application in spectral analysis of low frequency phenomena.

Generally, and in contrast to the Deltic loop, a digital filter of the present invention is adapted to accept a pulse train representative of a base frequency only, rather than of amplitude. For example, if a base signal is sinusoidal, its frequency can be digitized by insertion of the signal into an axis-crossing detector. The output pulse train of the detector then contains information relating only to input frequency, all information relating to the magnitude and sense of amplitude being discarded.

Means are provided for time-compressing the frequency information, and to this end there is included a selective gating system which, in effect, holds for sampling and then samples, in accordance with sampling signals, the input pulse train, and synchronously inserts the samplings into the input of a serial data storage or memory device. The samplings are stored in the memory for a predetermined time period and are presented seriatim at an output terminal. Means are also provided for connecting and disconnecting a feedback loop from the output terminal to the input of the memory device in accordance with the presence or lack thereof of a sampling signal. Alternatively, rather than employing sampling signals to inhibit (or enable as the case may be) feedback, the feedback itself may be employed to provide inhibition or enablement of the sampling signals. The time-compression achieved in the memory is of the frequency information. The time-compressed pulses are then time-expanded by appropriate means so that the frequency or repetition rate of the output signal of the filter is then a multiple or sub-multiple of a time-average of the original input frequency. With appropriate choice of parameters, the frequency "gain" of the filter can be made unity, or any other arbitrary rational number, for static or quasi-static conditions of input frequency. Unlike other frequency changers, such as harmonic generators, static input and output repetition rates of the filter are related according to a ratio of two scaling divisors which then in decimal notation can be either a repetitive or a terminating rational number and is not limited to whole numbers. However, when the input frequency conditions are dynamic or discontinuous, the filter does not provide a corresponding discontinuity, but acts, somewhat in the manner of an integrating operational amplifier, to reflect a discontinuous or step input frequency change as a "continuous" or ramp-like output frequency change.

For example, referring now to FIG. 1, there will be seen an embodiment of the filter of the present invention including means for sampling the repetition rate of an input pulse train $P_{IN}$. Such means is shown as comprising flip-flop 20 having set and reset terminals 22 and 24 respectively. One of terminals 22 and 24 is adapted for connection to the source of $P_{IN}$, the other of the terminals being connected to the output of a two-input-terminal coincidence or AND gate 26. Flip-flop 20 also has an output terminal 28 at which a signal will or will not appear depending upon the selective excitation of the set and reset terminals. The embodiment of FIG. 1 also includes a pair of two-input terminal coincidence or AND gates 32 and 34 having their respective output terminals buffered together at the input of OR gate 36. The output of gate 36 is coupled to one input terminal 37 of another two-input AND gate 38, the other input terminal 39 of gate 38 being connected to a source of timing pulses, such as clock 40. The output of gate 38 is connected to the input of a serial memory, such as delay line 42. The output of delay line 42 is connected via a feedback loop 44 to one input 45 of gate 42 and is also connected to the input of first frequency divider or scaler 46.

Clock 40 is also connected to the input of second frequency divider or scaler 48, the output of the latter being connected to inhibiting input terminal 49 of gate 32, to enabling input terminal 50 of gate 34, and to enabling input terminal 51 of gate 26. Connected to output terminal 28 of flip-flop 20 are input terminals 52 of gate 34 and 53 of gate 26.

In operation, it can be assumed that $F_c$ is the frequency or repetition rate (which terms are used interchangeably herein where the context so permits) of the signal train from clock 40 and $F_s$ is the sampling pulse rate at the output of scaler 48. These rates are related by the simple equation $$R_c = \frac{F_c}{F_s} \qquad (1)$$

where $R_c$ is defined as the compression ratio and is the integral divisor provided by scaler 48. The latter, as is well known in the art, can typically be a multistage chain of multivibrators or flip-flops providing an ultimate output frequency ($F_s$ in this example) which is an integral, sub-multiple of its input frequency (e.g. $F_c$).

Hence, enabling input terminals 50 and 51 of gates 34 and 26 respectively, and inhibiting input terminal 49 of gate 32, are all simultaneously periodically energized at a rate $F_s$. Gates 26, 32, 34, 36 and 38 can be typical transistor gates, diode gates or the like, according to the needs of the designer as is well known in the art. $F_s$ is at least equal to or greater than the maximum expected repetition rate, $F_{IN}$ of the input signal $P_{IN}$.

The input pulse train $P_{IN}$ is typically derived, as hereinbefore explained, from a bipolar axis-crossing detector. Hence, each pulse of $P_{IN}$ will energize set terminal 22, providing an output on terminal 28 which will persist, for example, as a fixed DC level, until reset terminal 24 is energized. If there is a signal at terminal 28, it will also appear at terminals 52 and 53 of gates 34 and 26. When terminals 50 and 51 are simultaneously energized by a sampling pulse, both gates 34 and 26 will provide output pulses. The pulse from gate 26 then resets flip-flop 20 and the output on terminal 28 disappears, to reappear at the time of the next pulse in the train $P_{IN}$.

Figure 2:
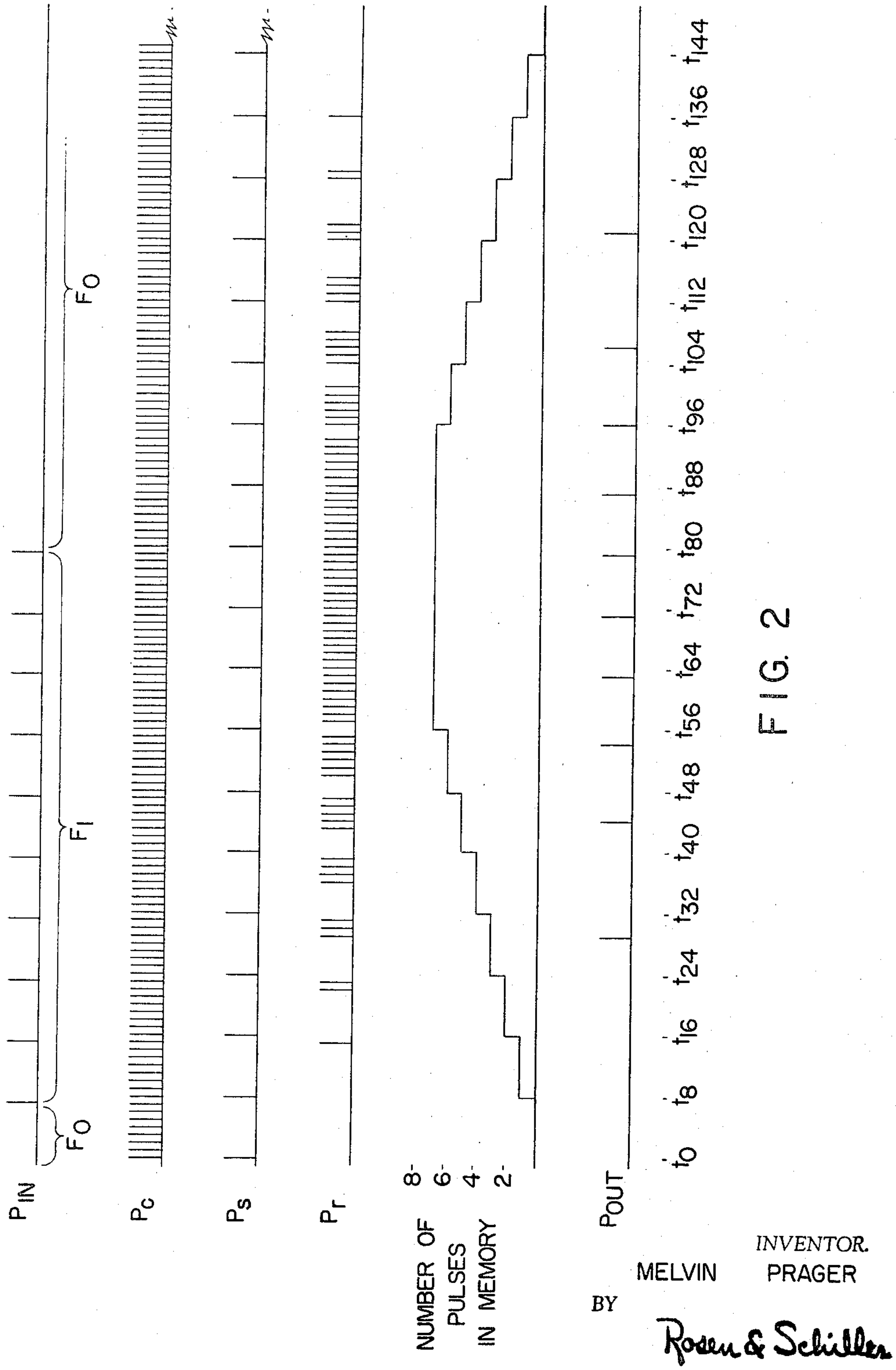
FIG. 2 is a timing diagram showing the relation of the pulses at various points in the embodiment of FIG. 1 during operation thereof.

Referring now to FIG. 2, there will be seen representations of certain exemplary graphs, all on the same horizontal time axis in microseconds. The first plot, labeled $P_{IN}$, is a pulse form of the input signal. Two pulse waveforms labeled $P_c$ and $P_s$ are respectively the pulse trains of frequencies $F_c$ and $F_s$.

For the sake of exposition, arbitrary values can be assumed in describing the plots of FIG. 2. For example, it can be assumed that the excursion of $P_{IN}$ is between zero repetition rate $F_0$ and an arbitrary repetition rate of magnitude $F_1$, and occurs substantially instantaneously. The clock pulse train $P_c$, for example, can be considered as having a 1 mc. repetition rate (readily attained typically from known crystal-controlled pulses oscillators or the like), the pulses thus being separated by 1 $\mu$sec, intervals and having a pulse width of much less than 1 $\mu$sec. If $R_c$ is taken at an exemplary value of 8, then the pulses in the sampling train $P_s$ are separated, as shown, by 8 $\mu$sec. intervals. The period of $P_{IN}$ pulses is also shown as 8 $\mu$sec solely for the sake of simplicity.

If, as shown, the first sampling pulse of interest occurs at $t_0$, the second at $t_8$, the third at $t_{16}$, then the $n$th pulse will occur at $t_{Rc_c(n-1)}$ where $t_0$ to $t_1$ is the basic period set by the clock pulse train. Assuming flip-flop 20 to be in its reset condition, because the excursion of $P_{IN}$ from $F_0$ to $F_1$ does not occur until after $t_0$, there is no output on terminal 28 of the flip-flop, and the enabling of gate 34 by the sampling pulse at $t_0$ does not create any output from gate 34. However, when gate 34 is next enabled at $t_8$ by the second sampling pulse, because a pulse of $P_{IN}$ has set flip-flop 20 and thus energized terminal 52 at $t_7$, an output first sampled pulse is provided by gate 34 through OR gate 36 to input terminal 37 of gate 38. The simultaneous inputs also occurring at terminals 53 and 51 of gate 26 energize reset terminal 24 of the flip-flop, restoring the latter in its reset condition. It will be appreciated that some small delay is desirable so that the flip-flop does not reset until the output pulse from gate 34 has occurred. Gate 38 is placed in enabled condition by the pressure at its other input terminal 39 of a clock pulse from clock 40 appearing at $t_8$, so that the first sample pulse is passed into delay line 42 which then operates as a serial memory. The delay line may be any appropriate storage device operated serially such as a shift register, magnetic drum, tape loop, core buffer storage, and the like, but is most simply and preferably a magnetostrictive delay line of known type. If the delay of line 42 is $T_d$, expressed for example in μsecs, the memory capacity M in bits (signal pulses i.e. ONES, or lack thereof, i.e. ZEROS) of the line can be defined as $$M=F_cT_d \quad (2)$$

If the memory delay $T_d$ should be selected to be, for example, one μsec. (i.e. a clock pulse interval) shorter than the period between sampling pulses, the sampled pulses inserted into the delay line at $t_8$ reappears at an input or recirculation terminal 45 of gate 32 1 μsec (as shown on the diagram of FIG. 2 marked $P_r$) before $t_{16}$, the time of the next successive sampling pulse. Gate 32, being uninhibited at $t_{15}$, thus applies the sampled pulse through OR gate 36 to coincidence gate 38 where the appearance of the enabling clock pulse at $t_{15}$ allows the sampled pulse to be reinserted into the delay line. The clock pulses, enabling gate 38, thereby provide precise timing for pulse reinsertion. One microsecond later, at $t_{16}$, gate 32 is inhibited and gate 34 is enabled by the third sampling pulse in train $P_s$. As the output of flip-flop 20 is energizing terminal 52 at $t_{16}$, a second sampled pulse is therefore inserted into the delay line, trailing the first sampled pulse by only 1 μsec. In a similar manner, subsequent bits taken at 8 μsecond intervals, either as ONES or ZEROS due to the nature of the output of flip-flop 20 existing at the time gate 34 is enabled, are inserted and reinserted in the delay line until the latter contain M bits separate by 1 μsec. intervals. Where, as in FIG. 2 $T_d$ has been chosen to be 7 μsec. and $F_c$ is 1 mc., then $M=7$. It should be emphasized that these values are set forth here solely for the sake of clarity in exposition. It will also be appreciated that the input pulses can be quite random, provided that $F_s$ is equal to or greater than the maximum $F_{IN}$ and, in some instances, additional synchronizing stages or flip-flops are provided.

It will be apparent that, although in the example given here, $P_{IN}$ goes to the $F_1$ level from $F_0$ substantially instantaneously, the transition of the $F_0$ frequency to the digital number representing the $F_1$ frequency requires a finite time, $T_c$ which is realted as follows:

$$T_c=\frac{M}{F_s}=\frac{F_cT_d}{F_s}=R_cT_d \quad (3)$$

Figure 3:
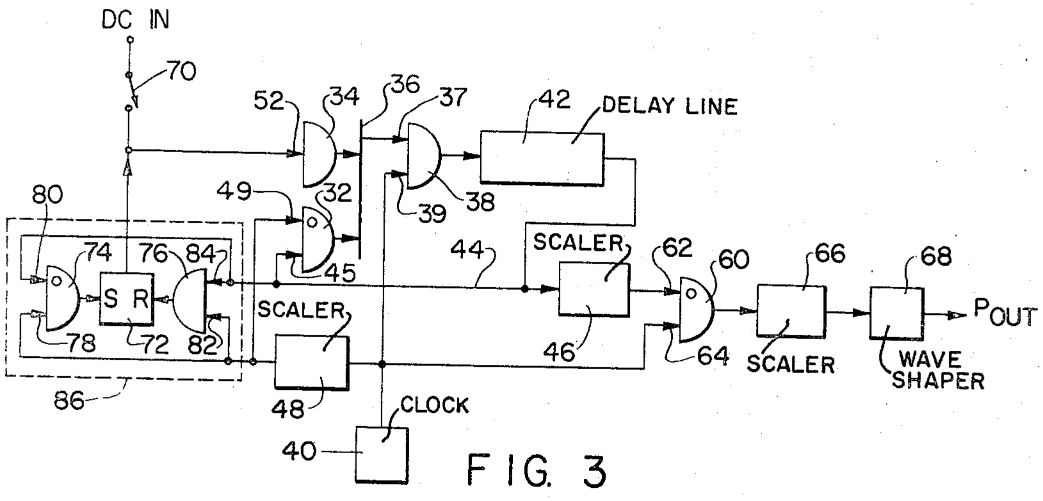
FIG. 3 is a block logic diagram of the digital filter system employed to form another embodiment of the present invention to provide a linear FM signal generator.

In the portion of FIG. 3 wherein the number of pulses stored in the delay line are plotted against the time axis, it will be seen that the digital representation (number of bits) of the frequency of $P_{IN}$ varies in time in discrete uniform increments or steps forming a "staircase" or ramp which indicates the "smooth" digital transition during $T_c$ of a discontinuous analog value change occurring immediately prior to the beginning of period $T_c$. Hence $T_c$ is the time constant of the system.

When delay line 42 becomes full, the first inserted sampled pulse will arrive at recirculation input 45 of gate 32 simultaneously with the occurrence of a sampling pulse from compressor 48. This is shown in FIG. 2 as occurring at $t_{64}$. Because gate 32 is then inhibited by that sampling pulse, the first inserted sampled pulse is discarded; however, simultaneously, gate 34 is enabled so that the output thereof, either as a pulse (ONE) or no pulse (ZERO), is inserted into the delay line. It will be apparent that the content of the delay line is then being continually revised or updated as the older data is simultaneouly discarded.

Because the delay line will contain digital information in the form of M bits separated by 1 μsec. clock intervals (according to this example), the M bits being representative of analog information occurring over a period of time approximately M*x*R μsec, the information in the delay line can be considered time-compressed.

The output of the delay line is also connected to the input of scaler 46, such as a frequency divider of known type formed for example as is scaler 48. The output is therefore, on passage through scaler 46, "time-expanded" to provide a given output frequency. For the steady or static state of $F_{IN}$, the output frequency $F_{OUT}$ of the scaler is related to $F_{IN}$, i.e.

$$F_{OUT}=\frac{R_c}{Y}\cdot F_{IN}$$

For the changing or dynamic state of $F_{IN}$, the preceding Equation 4 is equally valid if it is then understood that $F_{IN}$ refers to an average value of $F_{IN}$ over a period of time. If the divisor Y provided by scaler 46 is equal to $R_c$, the static frequency "gain" is unity.

Referring again to FIG. 2, it will be seen that, by a reverse process of storage of ZEROS rather than ONES, the delay line can be considered to dump its memory upon reversion of the input signal $P_{IN}$ from its $F_1$ level to its $F_0$ level. And even if this reversion is substantially instantaneous, the dumping of the memory requires a finite time, i.e. $T_c$, which has already been defined. Thus, the discontinuous change in input frequencies of $P_{IN}$ are smoothed or filtered by the present invention to provide the symmetrical representation marked $P_{OUT}$, indicating that the discontinuities of $P_{IN}$, within the limits of quantized steps, have been smoothed with a delay or integration time constant of $T_c$, or expressed in another manner, have been averaged over a period ($T_c$) of time. The averaging, of course, is weighted by the "gain," i.e. the ratio $R_c/Y$. In effect, the filter of FIG. 1 within the time constant acts somewhat as an integrator in that a step input of frequency produces a linear change in frequency at the output. In a more general sense, the filter provides an output frequency which is the time-average of the input frequency. Hence, it can serve as a matching filter, for example, to a step-motor in a position control system. By doing so, it is possible to achieve approximately an order of magnitude improvement in motor speed without sacrifice in accuracy.

The nature of scaler 46, which is in effect a counter, will under some circumstances, create a dissymmetry between the beginning (i.e. around $t_{24}$) and the ending (i.e. around $t_{120}$) time rates of frequency change in $P_{OUT}$, although the pulse trains representative of these rates appear symmetrically at the output of the delay line. In effect, this is a skew due to phase shift introduced by the scaler. To a large measure, this dissymmetry can be minimized, if desired, by having scaler 46 preset with a count of approximately $Y/2$. Thus, $P_{OUT}$ shown is based upon a Y of 8 for scaler 46, the latter being preset with a count of 4. It is of interest that where $R_c=Y$ and the frequency "gain" is therefore unity, counter or scaler 46 will continue to remain preset with the original count of $Y/2$, i.e. the phase shift remains constant.

Because the digital filter system of FIG. 1 provides an extremely stable time-variant frequency function which can, depending for example on the extent of the time-compression, be achieved with a high order of accuracy, the substance of the digital filter system can be used in the formation of digital generators of various time functions of frequency. For example, one can thus generate a wave-train whose frequency varies as a function (for example linearly) of time between two frequency limits, $F_1$ and $F_2$. A typical function of this type is $$F_{OUT}=F_1+kt \quad (5)$$

where $t$ is a fixed sweep time interval and $k$ is any arbitrary number. Thus, if $F_1$ is 3.3 kc., $t$ varies from 0 to 0.5 second and $k=800$, the generated output waveform will exhibit a linear frequency change from 3.3 to 3.7 kc. over a 0.5 second interval.

This can be achieved broadly by providing a fixed frequency signal as one limit, providing a time-linear frequency variation of proper scope, and literally subtracting (or adding, as the case may be) the linear frequency variation from the fixed frequency signal. The time-linear frequency variation is advantageously provided by a digital filter similar to that shown forming part of FIG. 3. As in FIG. 1, like numerals being employed to indicate like parts, the embodiment of FIG. 3 includes inhibit means such as two-legged gate 32 having recirculating input terminal 45 and inhibiting terminal 49. In order to be consistent with FIG. 1, input gate 34 is also included, but is shown as being single-legged, i.e. only one input terminal 52 is employed. Gate 34 is therefore not, strictly speaking, a coincidence gate which can perform sampling, but does have an output whenever an input signal is applied to terminal 52. Gate 34, as later described in detail, serves as a reset control to the time compressor. This embodiment also includes OR gate 36 which buffers together the outputs of gates 32 and 34, and which in turn has its output connected to one input terminal 37 of AND gate 38. The output of the latter is connected to the input of delay line 42. Feedback path 44 is provided for connecting the output of delay line 42 with recirculating input terminal 45.

As in FIG. 1, the embodiment of FIG. 3 also includes clock 40 connected to enabling input terminal 39 of gate 38 and also connected to the input of a frequency divider or scaler 48. The output of the latter is connected to inhibiting terminal 49 of gate 32. Similarly, the output of delay line 42 is also connected to a frequency divider or scaler 46.

Additionally, the embodiment of FIG. 3 includes subtraction means in the form of another concidence gate 60 having inhibiting input terminal 62 connected to the output of the first scaler 46. Another input terminal 64 is connected to the output of clock 40. The output of gate 60 is connected to the input of another or third scaler 66. If, as in the present embodiment, it is desired to provide a specific wave form for the output signal, the output of scaler 66 can be connected to the input of a wave shaper such as the square wave generator or binary-counting flip-flop 68.

It will be apparent that, unless inhibiting terminal 62 of gate 60 is activated, all of the pulses from clock 40 will appear in the gate output, and as divided by the divisor Z provided by third scaler 66 (or by the product 2Z if one also considers the effect of flip-flop 68 in providing a square-wave train from a pulse train) constitutes the fixed frequency portion, for example $F_2$ of the desired function.

Hence, $$F_2=\frac{F_c}{Z} \tag{6}$$

The desired time-variant frequency function is provided by the operation of the digital filter portion of the embodiment of FIG. 3, and to this end means are provided for periodically resetting the operation of the filter so that the desired function is repetitive or periodic. For this purpose, either an automatic or manual control means can be provided, either being optional. FIG. 3 shows both control means, it being understood that use of the two reset means shown should be mutually exclusive and not conjunctive. The manual reset means simply comprises switch means 70 for coupling as through single-legged gate 34, to an input of OR gate 36, a steady state DC level preferably of at least the maganitude of pulses provided to gate 36 by AND gate 32. Alternatively, automatic reset means 86 can be provided in the form including static flip-flop 72 having its output coupled, also as through gate 34, to OR gate 36. Flip-flop 72 is controlled at its set and reset inputs by respective coincidence gates 74 and 76. Gate 74 is a two-input terminal gate having one input terminal 78 connected to the output of compressor 48 and the other, or inhibiting terminal 80 connected to the output of delay line 42. Similarly, gate 76 is a two-input terminal gate having one input terminal 82 connected to the output of compressor 48, its other, or enable, terminal 84 being connected to the output of delay line 42.

In operation, it can be assumed that the automatic reset means is disconnected, as by uncoupling the output of flip-flop 72 from input terminal 52, and that only the manual reset means is operative. Closure of switch 70 then introduces a steady-state DC signal of appropriate magnitude from a suitable source (not shown) such as a battery, Zener-controlled reference or the like, through gates 34 and 36 to terminal 37 of gate 38. Because terminal 37 is theen energized at a steady-state level, the periodic enablement of gate 38 by clock pulses applied to terminal 39 will result in a series or train of pulses of repetition rate $F_c$ being introduced into serial memory 42. The latter fills, in the periodic of its delay time, until the first pulse of the train appears at the memory output and thus, by virtue of feedback path 44, at recirculating terminal 45 of gate 32.

Now, if the function to be produced is one wherein $F_{OUT}$ is to vary from $F_2=3.7$ kc. to $F_1=3.3$ kc. with variation of $t$ from 0 to 0.5 second as hereinbefore suggested, one can assume that $f_c$ is 1 megacycle, $R_c=708$ and $T_D$ is 707 $\mu$sec. Thus, because the clock pulses gate signal pulses into the memory at a repetition rate of $F_c$ after the first 707 pulses, the 708th clock pulse and thus the first pulse out of memory 42 will occur simultaneously with a sampling pulse from compressor 48. Because the latter pulse inhibits gate 32, no pulse reinsertion is made, assuming that by that time switch 70 has been opened and no signal is applied to gate 34. Hence, effectively a ZERO has been inserted into the pulse train (or string of ONES) in the delay line or memery. Obviously, with no energization of gate 34, the inhibition of each next 708th pulse will result in a dumping of the memory linearly from a content of 707 pulses to 0 pulses, and this will occur in a period which is the time constant of the system, i.e.

$$T_c=R_cT_d \tag{7}$$

hence $T_c\cong 0.5$ sec.

The repetition rate of the pulses in the output of memory 42 thus is seen to vary from a maximum of 1 megacycle to zero in 0.5 second. As these pulses pass through scaler 46, their frequency or repetition rate is divided by a number Y, such as 9, and thus inhibiting terminal 62 of gate 60 is energized at a repetition rate which varies from approximately 111.1 kc. to zero. It will be apparent that at the maximum inhibiting action, every ninth clock pulse at terminal 64 is blocked, and at a minimum (i.e. zero inhibiting pulses) all clock pulses are paassed through gate 60. The output gate 60 will thus vary during $t_0$ to $t_{0.5}$ from approximately 0.889 mc. to 1 mc., as the output of first scaler or 46 goes from 111.1 kc. to zero. If now second scaler 66 is provided so that it divides input frequencies by a divisor Z of 135, and if static flip-flop 68 is employed (and thus constitutes a divide-by-two device) then $F_{OUT}$ will vary during $t_0$ to $t_{0.5}$ from 3292 c.p.s. to 3704 c.p.s. or approximately 3.3 to 3.7 kc., thus providing the function sought. This is a repetitive function only if switch 70 is normally closed and opened periodically. In order to assure an accurately timed periodic function, automatic reset means 86 is preferably employed in place of switch 70. In such case, flip-flop 72 is intended to provide the requisite steady-state DC signal to gate 34 until memory 42 is filled. Thus, as the first pulse along feedback path 44 appears at terminal 45 simultaneously with the appearance at inhibit terminal 49 of the sampling pulse from compressor 42 (as hereinbefore described), that first pulse and that sampling pulse also simultaneously appear respectively at input terminals 84 and 82 of gate 76. This enables gate 76 and the gate output turns off flip-flop 72, i.e. the output of the latter no longer energizes gate 34. Each sampling pulse thereafter provided by compressor 48 will be accompanied by a simultaneous signal pulse on path 44 until all of the pulses in memory 42 are dumped. The next sampling pulse appearing at terminal 82 will then not have an accompanying signal pulse at terminal 48, and gate 76 is disabled and will have no output. The simultaneity of pulses along feedback path 44 and from compressor 48 will have also kept gate 74 de-energized inasmuch as the pulses at terminal 80 act to inhibit the gate. Upon the appearance of the sampling pulse at terminal 78 unaccompanied by a pulse at terminal 80, gate 74 becomes energized, turning flip-flop 72 on and delivering the requisite DC signal to gate 34 to restart the process of filling the memory again. The interval between the time at which the last pulse is discarded from the memory and the time at which the memory becomes completely filled (illustrated in FIG. 4 as the retrace time) is, of course, the time delay $T_d$ of the memory.

Figure 4:
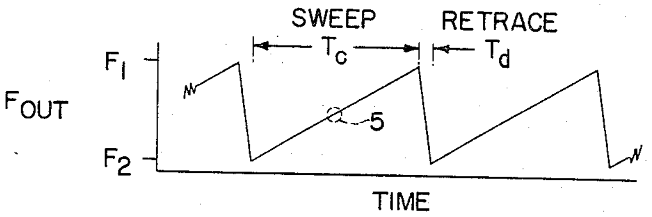
FIG. 4 is a frequency-time plot showing a typical idealized "waveform" of the output of the embodiment of FIG. 3.

The ramp-like function is then, as shown in FIG. 4, periodic with a "sweep-time" of $T_c$ between upper frequency limit $F_2$ and lower limit $F_1$.

It will be seen that, in the embodiment of FIG. 3, the parameters selected are related as follows:

$$Z=\frac{F_c}{2F_2} \tag{8}$$

$$Y=\frac{F_2}{F_2-F_1} \tag{9}$$

Figure 5:
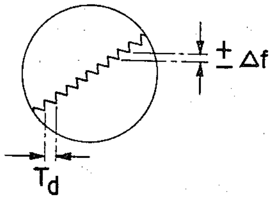
FIG. 5 is a frequency time plot showing detailed frequency variation of an expanded portion of the plot of FIG. 4 indicated on the latter at broken circle 5.

Necessarily, the sampling period and the memory storage period cannot be the same. Each must be an integral multiple of the clock period and the multiples must be relatively prime to each other. In the operation of the embodiment of FIG. 3, the frequency variation in the output ideally varies linearly but in small, discrete and uniform steps $\pm\Delta f$ as shown in FIG. 5. This ideal can only be approached as the pulses within the delay line approach uniform spacing therein.

A certain amount of "FM noise" will appear in the output as a function of the bunching, or non-uniform spacing, of the pulses circulating within the serial memory. In practice, the designer may minimize this problem through choice of the $R_c{:}M$ ratio and/or by the use of two filters in series, each similar to that of FIG. 3, but with the second having a total time constant approaching the circulation time of the first.

With slight modification, other functions can readily be generated by the device of FIG. 3. For example, first scaler 46 can be provided as a counter which responds to or counts only the ZEROS or lack of pulses in the output of memory 42 (as by gating the clock pulses into the scaler 46 in accordance with the inhibition of a gate by the output of the memory). In such case, the ramp of the output would be reversed and the $F_{OUT}$ of the example thus modified would vary downwardly instead of upwardly.

By modifying the logic of the delay line input, the embodiment of FIG. 3 can readily be made to generate a sawtooth type of function frequency, i.e. one exhibiting periodic alternating "up" and "down" ramps of frequency variation. Signals having linear functions of frequency of the type hereinbefore described, find application in precision measuring equipment, and in high resolution active sonar and radar devices.

Yet other functions of frequency can be generated with devices employing the techniques of the present invention. For example, referring to FIG. 6, there will be seen another embodiment of the present invention in a block logic diagram of a generator for producing an exponential frequency function. This generator comprises AND gates 32 and 34 buffered by OR gate 36, the latter being connected through gate 38 to delay line or memory 42 as hereinbefore described. Also included are clock 40 for timing gate 38, and control apparatus, such as set-reset means 70, having its output connected to respective enabling input terminals of gates 32 and 34.

Figure 6:
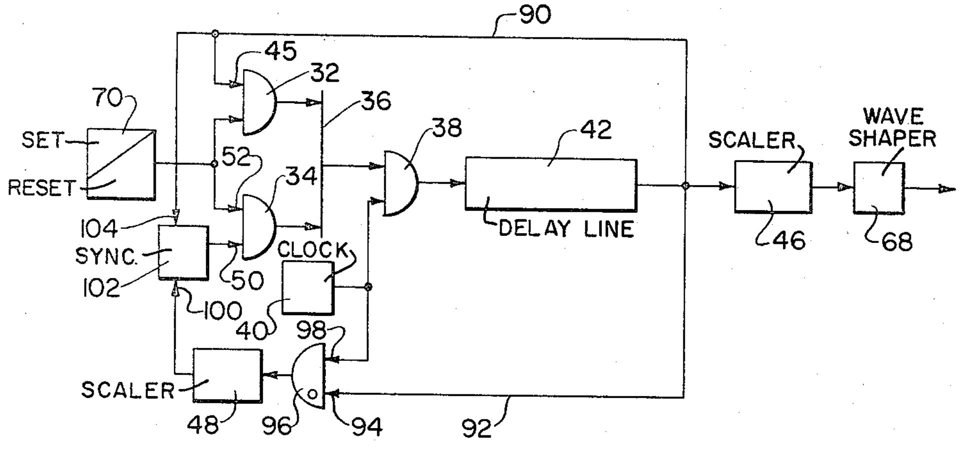
FIG. 6 is a block logic diagram of the digital filter system employed to form yet another embodiment of the present invention to provide an exponential FM signal output.

The embodiment of FIG. 6 however includes two feedback paths, 90 and 92. Path 90 connects the output of memory 42 to input terminal 45 of gate 32. Path 92 connects the output of memory 42 to inhibiting terminal 94 of two-input coincidence gate 96. The other input terminal 98 of gate 96 is connected to the output of clock 40. The output of gate 96 is connected to the input of scaler 48, the output of the latter being in turn connected to input terminal 100 of synchronizer means 102. Another input terminal 104 of the synchronizer means is connected to feedback path 90. The output of the synchronizer means is coupled to input terminal 50 of gate 34.

Lastly, the output of memory 42 is also connected through scaler 46 and wave-shaper 68 to provide a final output. Initially, it can be assumed that memory 42 is completely empty. In operation, control means 70 then provides a steady-state DC of appropriate magnitude which enables both gates 32 and 34. There being no inhibiting pulses at terminal 94, gate 96 passes clock pulses at the repetition rate as generated by clock 40 into scaler 48. The maximum pulsed output of the latter is, as hereinbefore described, $F_c/R_c$.

Assuming that the output of compressing scaler 48 is fed directly to terminal 50, bypassing synchronizer means 102, all the scaled clock pulses are passed into enabled gate 34, through OR gate 36 and synchronously enabled gate 38 into memory 42. It will be apparent that the latter then begins to fill at an initially "high" rate with pulses spaced in time intervals of $R_c$ times the clock pulse unit. After $T_d$ has elapsed, the first pulse into the memory now appears in the feedback paths.

The pulse output of the memory is fed back along path 90 and, as long as gate 32 is enabled, is wholly reinserted into the memory input. However, the memory output is also fed back along path 92. Each pulse on path 92 inhibits gate 96, creating a corresponding ZERO or no-pulse condition which appears in the pulse train output of gate 96. Scaler 48, counting the number of pulses from gate 96, thus provides a progressively reduced pulse rate in its output as a result of the inhibiting effect of the feedback on gate 96.

In effect then, scaler 48 counts the ZEROS in the memory. Initially, when the memory is empty (full of ZEROS) and its frequency output is therefore zero, the output rate of scaler 48 is at its maximum. As the memory begins to fill and feedback commences, the output rate of scaler 48 drops, reflecting the decreased number of ZEROS (or the increase in number of pulses or ONES) in the memory.

Assuming no finite delays in the operation of gate 96 and scaler 48, it will be seen that the output of gate 96, and thus scaler 48, is a pulse or ONE only when the memory output appearing at terminal 45 is a no-pulse or ZERO condition. Each ZERO appearing at terminal 45 then is accompanied by a pulse at terminal 50 which is then inserted, in place of the ZERO, into the memory. The addition of each newly inserted pulse to the reinserted pulses serves to increase the number of inhibiting signals on gate 96. Finally, no ZEROS or no-pulse positions will be left in the memory, and the latter will be filled with pulses spaced at time intervals of $1/F_c$ apart. If the clock frequency is 1 mc., then the memory output frequency will have changed from zero to 1 mc. in a finite time, the change being exponential. The provision of scaler 46 and wave-shaper 68 merely provides a desired frequency reduction and does not affect the nature of the change itself.

As a practical matter, however, a finite delay will often occur in the operation of the gates and scalers. As a result, to insure truly synchronous operation, particularly simultaneity of ZEROS at terminal 45 and ONES at terminal 50, the embodiment of FIG. 6 includes synchronizer means 102. The latter can be formed as a flip-flop which is inhibited by pulses at terminal 104 so as to hold any pulse at terminal 100 until a no-pulse condition exists at terminal104, and thence to permit transmission of the held pulse from terminal 100 to terminal 50. Such devices are well known in the art.

Since certain changes may be made in the above apparatus without departing from the scope of the invention herein involved it is intended that all matter contained in the above description or shown in the accompanying drawing shall be interpreted in an illustrative and not in a limiting sense. For example, the devices hereinbefore described can be modified to "count" ONES instead of ZEROS (or vice-versa where applicable). This will usually result in a change in the "sign" of the output function. For instance, the device of FIG. 6 can be constructed so as to start with an initial condition wherein the delay line, instead of being empty (all ZEROS) is completely full (all ONES), and feedback after scaling will inhibit ONES. The frequency output will then change exponentially from an initial finite level to zero. Alternatively, the device of FIG. 6 can be constructed so as to start with an initial condition wherein the delay line is empty except for at least one initial pulse, but gate 96 is inhibited by no-pulses instead of pulses (or is pulse-enabled). In such event, the memory output is also exponential, but the rate of frequency change increases in time rather than decreases, to give a positive exponential instead of a negative exponential.

Typically, the invention can be used to form other function generators. For example, if one feeds the output of the embodiment of FIG. 1 into another such embodiment, the output of the latter is a double integral of the initial input frequency.

What is claimed is:

1. A digital filter comprising:
means for serial-memory-time-compressing pulse samplings, taken at a predetermined rate, of only the frequency of an input signal; and
means for time-expanding the compressed pulse samplings so as to provide an output signal having a frequency which is a weighted average, over a predetermined time period, of the input signal frequency.

2. A digital device adapted for filtering an input pulse train having a changing repetition rate, said device comprising:
means for taking periodic sampled data of only the repetition rate of said input pulse train;
means having a serial storage device, with a feedback loop, for serially time-compressing said periodic sampled data; and
means for time expanding the compressed data so as to provide therefrom an output pulse train having a repetition rate which is a function of the average magnitude of the repetition rate of said input pulse train over a predetermined period of time.

3. A digital filter comprising:
means for converting an oscillatory signal into a pulse train having an instantaneous repetition rate numerically equal to the instantaneous frequency of said signal;
means for taking sampled data of only the repetition rate of said pulse train;
means for serially time-compressing said data; and
means for time-expanding the compressed data so as to provide a periodic signal having a second repetition rate which is a weighted average, over a predetermined time period, of the repetition rate of said pulse train.

4. A digital filter comprising: means for time compressing in a serial memory having a finite delay time digital sampling of only the repetition rate of an input signal said samplings being taken at a predetermined rate; means for frequency dividing said output of said serial memory so as to provide an output pulse train wherein the number and arrangement of pulses is a weighted average over a time period that is the product of said delay time and said predetermined rate.

5. A digital filter comprising:
means for providing a train of sampling pulses having a first repetition rate;
first gating means responsive to said train for taking samplings of the repetition rate of a series of input pulses;
serial memory means having an input connected to the output of said gating means for storing said samplings for a predetermined delay time period which is prime relative to the period of said train; means for forming a feedback path from the output to the input of said memory means, second gating means responsive to the combination of a signal at the output of said memory means and a portion of said train for transmitting along said feedback path information signals selected in accordance with the nature of said combination;
means coupled to the output of said memory means for dividing the repetition rate of signals appearing at said output; and
means for synchronizing the operation of all of the preceding means.

6. A digital filter comprising:
means responsive to a train of periodic timing signals, having a first repetition rate, for providing sampling signals at a second rate which is a sub-multiple of said first rate, said sampling signals being in either of two stable signal levels;
means for sampling the repetition rate of a periodic input signal in accordance with said sampling signals and forming a sampled signal train in which each sampled datum is the form of either of two stable signal levels;
means for storing seriatim said sampled signal train for a predetermined time interval which, in terms of the period of said timing signals is prime relative to the period of said sampling signals;
means for providing a feedback loop from the output to the input of the storage means so that sampled data appearing at said output of the storage means may be reinserted in its input;
means responsive to the level of one sampled datum in said feedback loop and to the level of a corresponding sampling signal for enabling or inhibiting the reinsertion of said one datum into the input of said storage means; and
means for dividing in accordance with a second sub-multiple the repetition rate of the seriatim data signals in the output of the storage means.

7. A digital filter comprising:
a clock for generating periodic timing signals at a first repetition rate;
means responsive to said timing signals for providing sampling signals at a second rate which is a sub-multiple of said first rate;
means for sampling the repetition rate of a periodic input signal in accordance with said sampling signals;
means for storing seriatim the sampling of said input signal for a predetermined time interval which in terms of the clock period is prime relative to the period of said sampling signals;
means for connecting a feedback loop from the output to the input of the storage means responsively to one of the absence and the presence of a sampling signal and for disconnecting said loop responsively to the other of said absence and presence of a sampling signal; and
means for dividing in accordance with a second sub-multiple the repetition rate of the seriatim samplings after said time interval, so that the divided repetition rate is a time-average of the repetition rate of said input signal, which average is weighted according to the ratio of said sub-multiples.

8. A digital filter comprising:
means responsive to a digital clock for providing periodic sampling signals at a first rate which is a sub-multiple of the repetition rate of said clock;
gating means selectively enabled by said sampling signals for taking samplings, at said first rate, of the frequency of an input signal;
serial memory means for storing said samplings for a delay time which in terms of the clock period is relatively prime to the period of the sampling signals;
means for forming a feedback path from the output to the input of said serial memory means;
gating means selectively inhibited by said sampling signals for preventing transmission of signals through said feedback; and
means for dividing in accordance with said sub-multiple the repetition rate of said samplings at the output of said memory means.

9. A digital filter comprising:
means for producing an input pulse train having an instantaneous repetition rate which is a function of the instantaneous frequency of an oscillatory signal;
means responsive to a digital clock for providing periodic sampling pulses having a periodicity which is a multiple of a clock period;
gating means responsive to said sampling pulses for providing data pulses representative of the repetition rate of said pulse train;
means for storing said data pulses seriatim for a predetermined time period which in terms of said clock period is prime relative to said periodicity of said sampling pulses;
means for forming a feedback path from the output to the input of said means for storing;
gating means responsive to said sampling pulses for disconnecting said feedback path; and
means for dividing the repetition rate of data pulses appearing at the output of said means for storing so as to provide an output pulse train having a repetition rate which is a weighted time-average of the repetition rate of said input pulse train.

10. A digital filter comprising:
a pulse generator for converting an oscillatory signal at its input into an input pulse train at its output;
a digital clock for providing a clock signal at a first repetition rate;
first scaler means responsive to said clock signal for providing sampling pulses at a second rate which is a sub-multiple of said first rate;
a first AND gate having an enabling input terminal connected to said first scaler means, and another input terminal thereof connected to said pulse generator;
a second AND gate having an inhibiting input terminal connected to said first scaler means;
an OR gate for buffering together the outputs of said first and second AND gates;
a third AND gate having an enabling input terminal connected to said digital clock and another input terminal connected to the output of said OR gate;
a serial storage device having its input connected to the output of said third AND gate, and its output connected to another input terminal of said second AND gate; and
second scaler means connected to the output of said storage device for dividing the frequency of an output signal from said storage device in accordance with said sub-multiple.

11. A digital filter comprising:
a clock for providing periodic timing signals at a first repetition rate;

first scaler means for providing sampling pulses at a second repetition rate, any period of which is an integral multiple of said first rate;
a first coincidence gate adapted to be enabled by said sampling pulses applied to an input terminal thereof;
a second coincidence gate adapted to be inhibited by said sampling pulses applied to an input terminal thereof;
means for coupling an input pulse train to another input terminal of one of said gates;
a serial storage device having an input and an output between which a pulse can transit in a finite time period which, in terms of the period of said clock rate, is prime relative to the period of said second rate;
means for buffering together the outputs of said gates and for connecting the buffered output, synchrnously with said clock, to the input of said serial storage device;
means providing a feedback loop from the output of said storage device to another input terminal of the other of said gates; and
second scaler means connected to the output of said storage device for dividing the repetition rate of pulses at said output in accordance with said multiple.

12. A digital frequency function generator comprising:
means providing an input pulse train having, during a predetermined time period, at least one change in repetition rate;
means for so-time-compressing, in a serial storage device having a feedback loop, said input pulse train as to provide a second pulse train having a variable repetition rate which varies as a time-average of the magnitude of the repetition rate of said input pulse train over said predetermined time period; and
means responsive to said second pulse train for providing a third pulse train having a repetition rate which is a predetermined function of the repetition rate of said output pulse train.

13. A digital frequency function generator, comprising, in combination:
means for providing a first pulse train at a first repetition rate for establishing timing increments;
first scaler means for providing a second pulse train at a second repetition rate which is a sub-multiple of said first repetition rate and is synchronous therewith;
serial memory means having a storage time which in terms of said increments is prime relative to the period of said second pulse train;
means for providing a train of binary bits timed in accordance with said first repetition rate and for storage in said memory means;
means providing a feedback loop from the output to the input of said memory means;
means for inhibiting feedback in said loop in accordance with said second repetition rate;
means for dividing the frequency of the output of bits from said memory means so as to provide a first output train;
means for summing said first output train with said first pulse train so as to provide a second output train; and
second scaler means for dividing the frequency of said second output train.

14. A digital frequency function generator as defined in claim 13 wherein said train of binary bits is predeterminedly limited in time and is periodically repeated.

15. A digital frequency function generator, comprising, in combination:
a clock providing at a first terminal a first pulse at a first repetition rate;
a first counter responsive to said first pulse train for providing a second pulse train at a second repetition rate which is a predetermined sub-multiple of said first rate;

a first coincidence gate having one input terminal adapted to inhibit said gate responsively to pulses of said second pulse train;

means providing a signal at a second terminal, a second coincidence gate having a pair of input terminals, one being connected to said second terminal and the output of said first gate, and the other being connected to said first terminal, said second gate being adapted to provide an output when energized at both input terminals;

serial storage means having an input connected to the output of said second gate and having an output terminal connected to the other input terminal of said first gate;

a second counter responsive to the output of said storage means for providing a third pulse train at a third repetition rate which is a predetermined sub-multiple of said first rate; and a third coincidence gate having one input terminal adapted to inhibit said gate responsively to pulses of said third pulse train, and another input terminal connected to said first terminal of said clock.

16. A digital frequency function generator as defined in claim 15 wherein said means providing a signal at a second terminal comprises a bistable device having an output which is at one of two stable states according to the conditioning of a pair of input terminals, each of said terminals being conditioned respectively according to the coincidence of the pulses in said second pulse train with one of the output of said storage means and the complement of the output.

17. A digital frequency function generator as defined in claim 15 including a third counter responsive to the output of said third coincidence gate for providing an output pulse train.

18. A digital frequency function generator, comprising, in combination:

means for providing a clock pulse train at a first repetition rate for establishing timing increments;

compressor means for providing a gating pulse train at a second repetition rate which is a sub-multiple of said first repetition rate and is synchronous therewith;

serial memory means having a storage time which in terms of said increments is prime relative to the period of said second pulse train;

means having an output for providing a train of binary bits timed in accordance with one of said repetition rates connected to an input of said memory means;

means providing at least one feedback loop from the output to the input of said memory means;

means for inhibiting one of the feedback in said loop and said second repetition rate by the other so as to alter the nature of said train of bits;

means for dividing the frequency of the output of one type of bit in said train of bits from said memory means so as to provide a first output train;

means for summing said first output train with said first pulse train so as to provide a second output train;

means for scaling the frequency of said second output train, and means operatively connected to said means having an output for periodically providing said train of binary bits.

19. A digital frequency function generator comprising, in combination:

means for providing a first pulse train at a first repetition rate;

first scaler means for providing a second pulse train at a second repetition rate which is a sub-multiple of said first repetition rate and is synchronous therewith;

serial memory means having a storage time which in terms of said increments is prime relative to the period of said second repetition rate;

means providing a train of information bits initially spaced in time in accordance with said second repetition rate and for storage in said memory means;

means providing a first feedback loop from the output to the input of said memory means;

means providing a second feedback loop from the output to the input of said memory means, and including said first scaler means and means for inhibiting said first scaler means so as to alter said second repetition rate responsively to the bits appearing at the output of the memory means; and means for scaling the output of said memory means.

References Cited

UNITED STATES PATENTS

| | | | |
|---|---|---|---|
| 2,800,580 | 7/1957 | Davies | 340—355 |
| 2,892,933 | 6/1959 | Shaw | 328—50 |
| 2,910,237 | 10/1959 | Meyer | 235—164 |
| 2,951,202 | 8/1960 | Gordon | 324—79 |
| 2,958,039 | 10/1960 | Anderson | 324—77 |
| 3,184,663 | 5/1965 | Mergler | 318—39 |

MALCOLM A. MORRISON, *Primary Examiner.*

K. MILDE, V. SIBER, *Assistant Examiners.*